(12) United States Patent
Mosinskis

(10) Patent No.: US 8,664,774 B1
(45) Date of Patent: Mar. 4, 2014

(54) BONDWIRE CONFIGURATION FOR REDUCED CROSSTALK

(75) Inventor: Paulius Mosinskis, Richlandtown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 718 days.

(21) Appl. No.: 12/757,087

(22) Filed: Apr. 9, 2010

(51) Int. Cl.
*H01L 23/52* (2006.01)

(52) U.S. Cl.
USPC .... 257/784; 257/734; 257/773; 257/E23.141; 257/E23.153

(58) Field of Classification Search
USPC .............. 257/207, 208; 174/51, 78, 376, 520
See application file for complete search history.

(56) References Cited

U.S. PATENT DOCUMENTS

| 6,765,301 | B2 | 7/2004 | Wu et al. | |
| 6,933,599 | B2* | 8/2005 | Joiner et al. | 257/690 |
| 7,569,472 | B2 | 8/2009 | Ali et al. | |
| 2002/0163018 | A1* | 11/2002 | Kamiya | 257/208 |
| 2005/0017352 | A1* | 1/2005 | Lee | 257/728 |
| 2005/0087856 | A1* | 4/2005 | Joiner et al. | 257/690 |

* cited by examiner

*Primary Examiner* — Victor A Mandala
*Assistant Examiner* — William Harriston

(57) ABSTRACT

To protect victim bondwires in a packaged electronic component from crosstalk induced by noisy aggressor bondwires, shielding bondwires are configured between the victim bondwires and the aggressor bondwires. The shielding bondwires, on either side of the victim bondwires, are connected to the same reference voltage on the package side of the component and to each other on the die side of the component, e.g., via a metal connection mounted on the die. As configured in one embodiment, the shielding bondwires and metal connection form a two-dimensional Faraday cage that shields the victim bondwires from crosstalk induced by the aggressor bondwires.

11 Claims, 5 Drawing Sheets

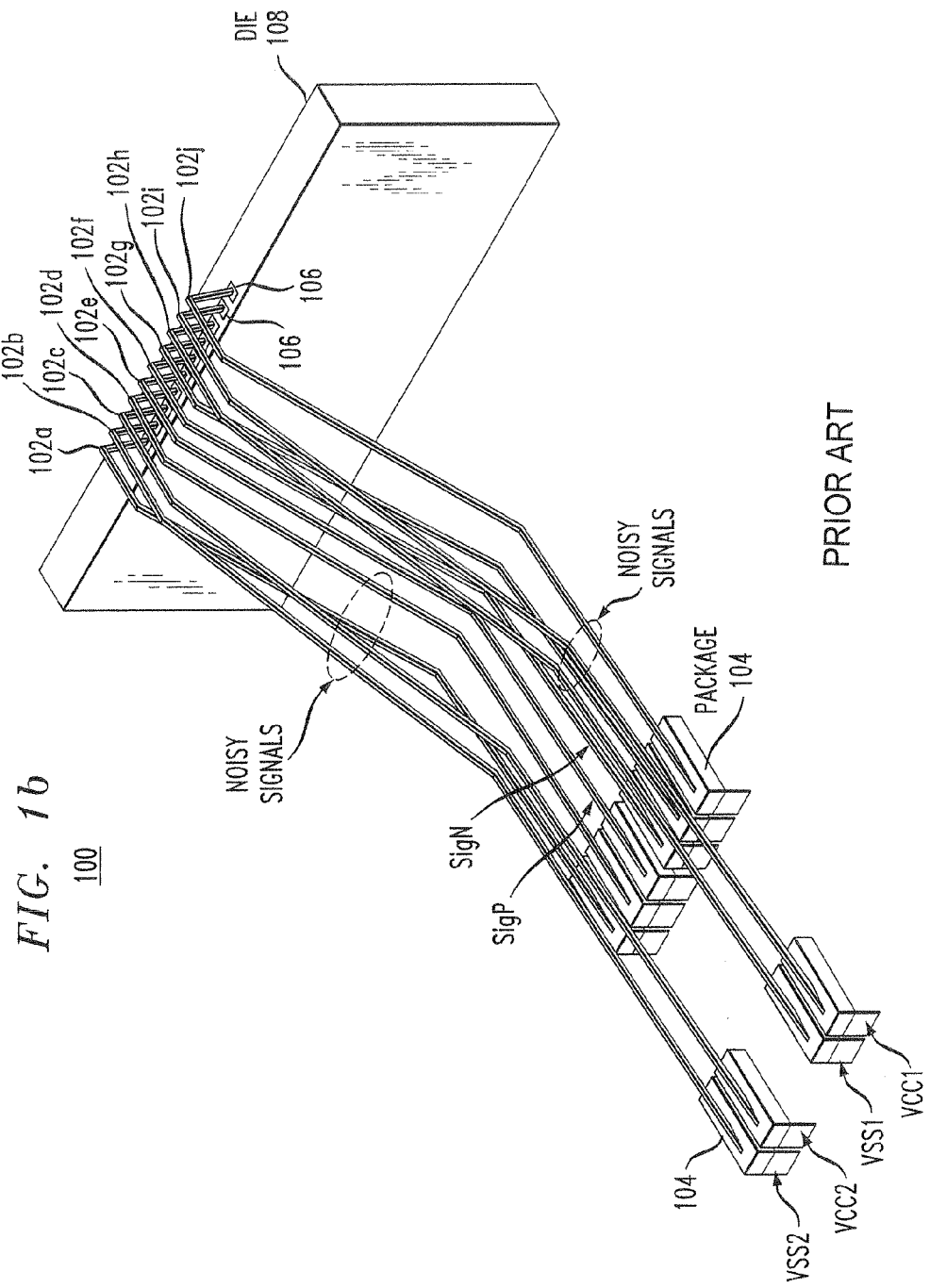

200

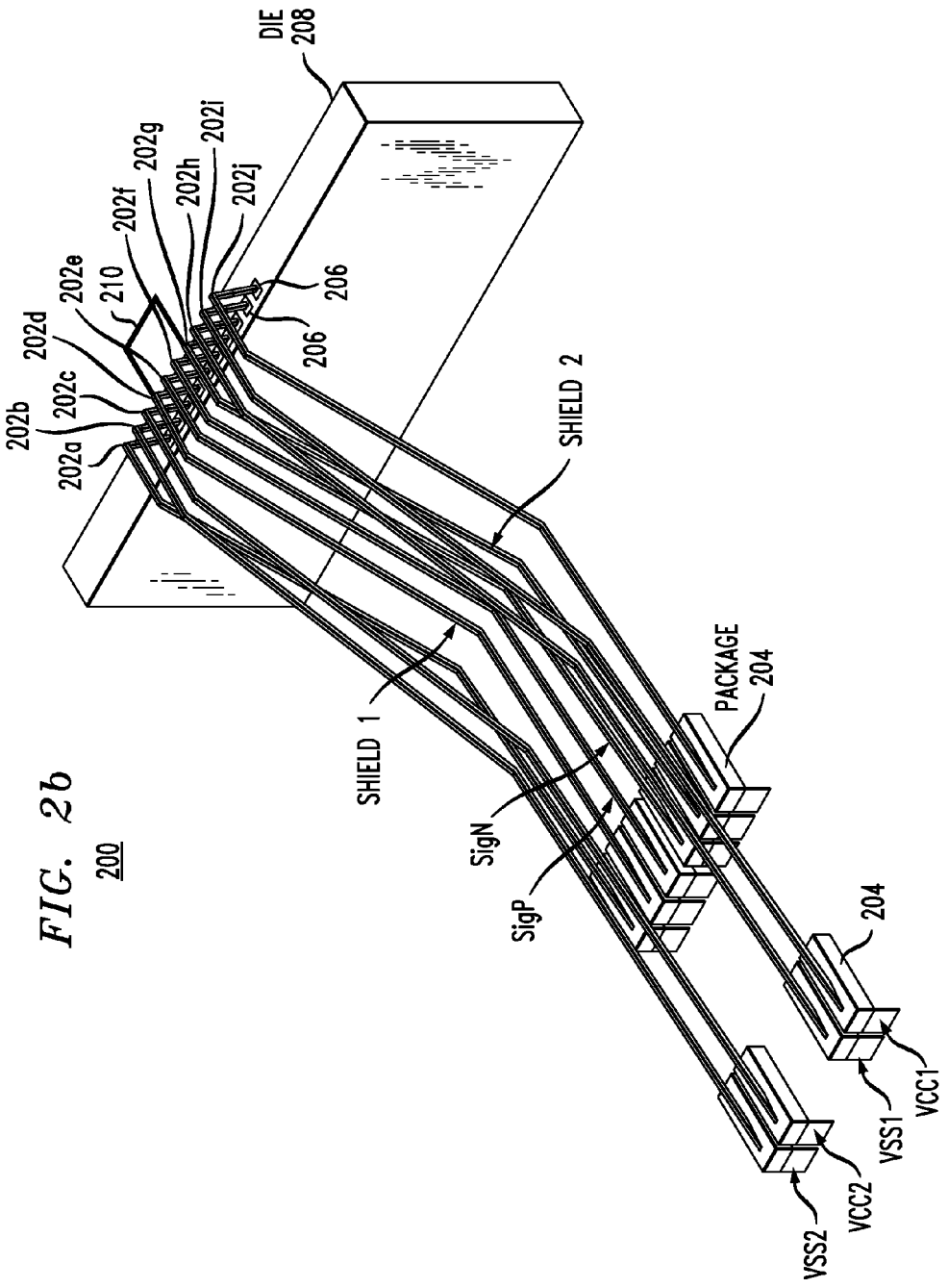

BONDWIRE CONFIGURATION FOR REDUCED CROSSTALK

BACKGROUND

1. Field of the Invention

The present invention relates to electronics, and, in particular, to configuring bondwires in integrated circuit packaging to reduce crosstalk.

2. Description of the Related Art

This section introduces aspects that may help facilitate a better understanding of the invention. Accordingly, the statements of this section are to be read in this light and are not to be understood as admissions about what is prior art or what is not prior art.

When implementing high-frequency SERDES (SERializer-DESerializer) links in low-cost bondwire (a.k.a. bond wire) packages, one major source of degradation is bondwire-to-bondwire crosstalk. Previous approaches to this problem have used spacing between noisy bondwires and critical signal bondwires as a method for minimizing crosstalk. This method is not suitable for certain applications in which die space is limited.

FIGS. 1a and 1b provide plan and perspective views, respectively, of a portion of a conventional packaged electronic component 100. In particular, FIGS. 1a-b show an exemplary set of bondwires 102a-j that connect bonding pads 104 on the package side of the component 100 to corresponding bonding pads 106 on die 108 on the die side of component 100. In this exemplary embodiment, bondwires 102b, 102c, 102h, and 102i carry reference voltages VSS2, VCC2, VSS1, and VCC1, respectively, while bondwires 102a, 102d, 102e, 102f, 102g, and 102j carry signals. Furthermore, the signals SigP and SigN carried by bondwires 102e and 102f, respectively, are analog differential signals that are relatively sensitive to noise, while the signals and reference voltages carried on bondwires 102a-d and 102g-j are relatively noisy.

The problem with component 100 is that noise on the so-called aggressor bondwires 102a-d and 102g-j can couple via crosstalk into the so-called victim bondwires 102e-f, adversely affecting signal-to-noise ratios of the analog signals carried on those victim bondwires and compromising circuit functions that rely on those analog signals.

SUMMARY

In one embodiment, the present invention is a packaged electronic component comprising a die defining a die side of the component, a package defining a package side of the component, and a plurality of bondwires interconnecting the die and the package. The plurality of bondwires comprises a first set of one or more victim bondwires, one or more aggressor bondwires on one or both sides of the first set, and first and second shielding bondwires between the one or more aggressor bondwires and the first set. The first and second shielding bondwires are electrically connected (i) to a first reference voltage on the package side of the component and (ii) to each other on the die side of the component.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIGS. 1a and 1b provide plan and perspective views, respectively, of a portion of a conventional packaged electronic component;

FIGS. 2a and 2b provide plan and perspective views, respectively, of a portion of a packaged electronic component according to one embodiment of the present invention;

DETAILED DESCRIPTION

Figure 1A:
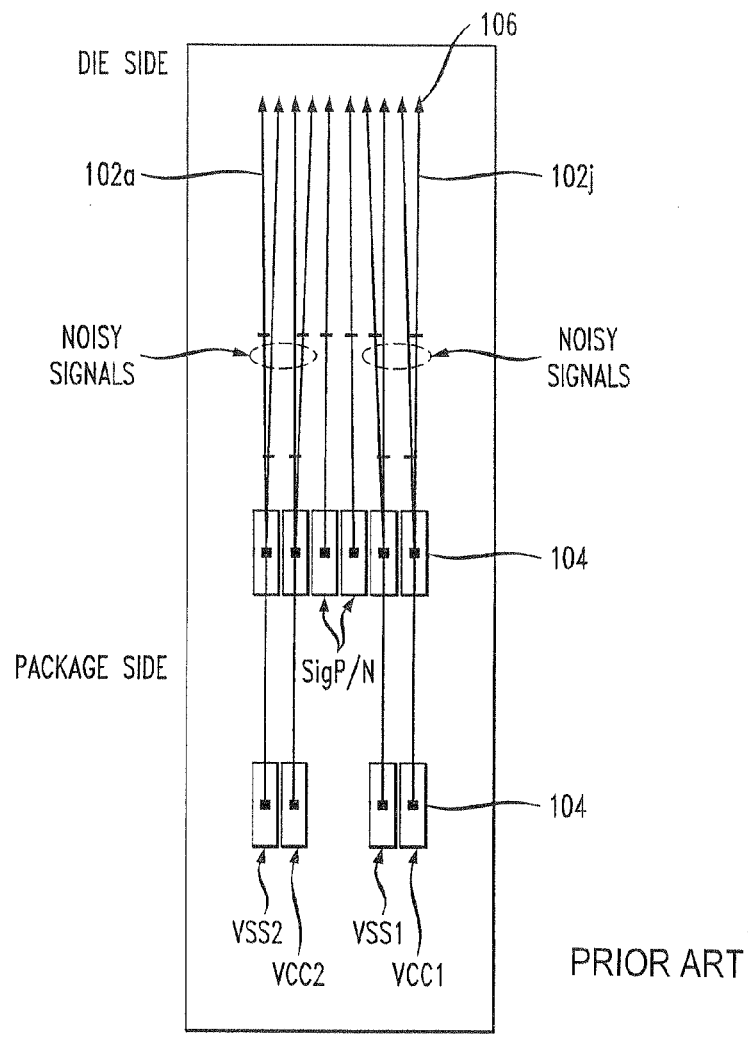
Figure 2A:
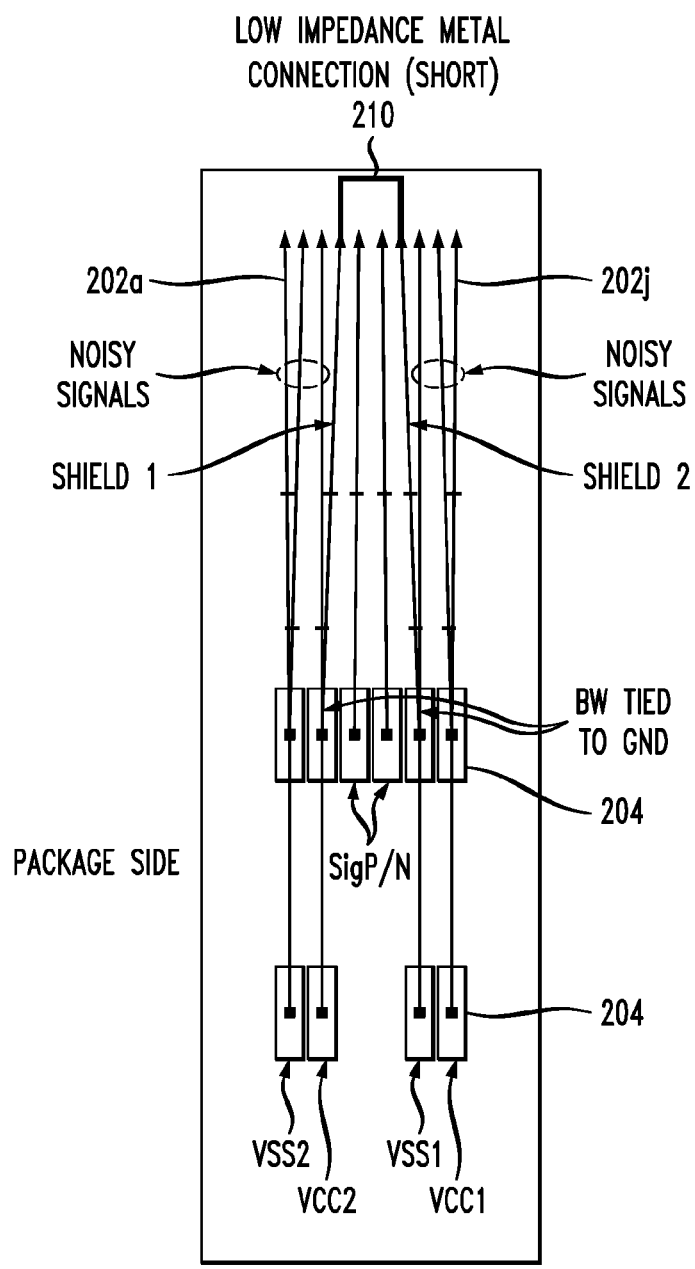

FIGS. 2a and 2b provide plan and perspective views, respectively, of a portion of a packaged electronic component 200, according to one embodiment of the present invention. Similar to FIGS. 1a-b, FIGS. 2a-b show an exemplary set of bondwires 202a-j that connect bonding pads 204 on the package side of the component 200 to corresponding bonding pads 206 on die 208 on the die side of component 200. In this exemplary embodiment, bondwires 202b, 202c, 202h, and 202i carry reference voltages VSS2, VCC2, VSS1, and VCC1, respectively, while bondwires 202a, 202e, 202f, and 202j carry signals. Furthermore, the signals SigP and SigN carried by victim bondwires 202e and 202f, respectively, are analog differential signals that are relatively sensitive to noise, while the signals and reference voltages carried on aggressor bondwires 202a-c and 202h-j are relatively noisy.

Unlike component 100, component 200 has shielding bondwires 202d and 202g that provide lateral electromagnetic shielding for victim bondwires 202e-f from crosstalk induced by noise on aggressor bondwires 202a-c and 202h-j. Shielding bondwires 202d and 202g are immediately adjacent to victim bondwires 202e and 202f, respectively, and also immediate adjacent to aggressor bondwires 202c and 202h, respectively. Shielding bondwires 202d and 202g are connected to the same reference voltage (e.g., ground) on the package side of component 200 and to each other via low-impedance (e.g., metal) connection 210 on the die side of component 200 (e.g., with connection 210 supported on die 208). Connection 210 can be formed from any suitable electrically conductive (i.e., low ohmic) material, such as (without limitation) a metal, an appropriately doped silicon, or a polycrystalline silicon. With this configuration, grounded shielding bondwires 202d and 202g and connection 210 form, around victim bondwires 202e-f, a two-dimensional Faraday cage that reduces crosstalk noise in the signals carried by victim bondwires 202e-f.

Note that the materials, profiles, and processing used for shielding bondwires 202d and 202g can be the same as those used for the other bondwires in component 200, e.g., standard gold bondwires and copper die metallization applied using conventional device packaging equipment.

Figure 3:
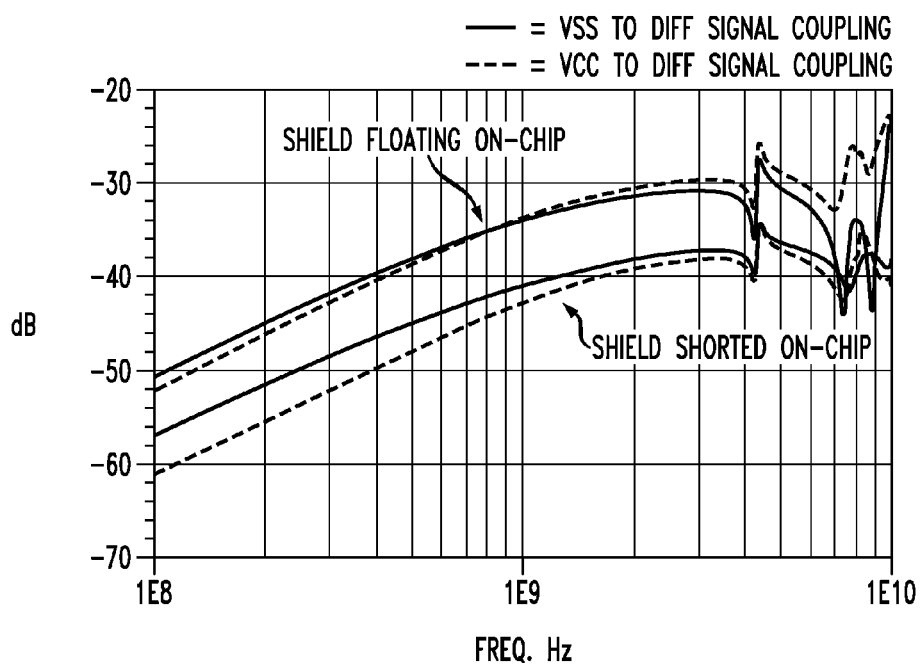
FIG. 3 shows the magnitude of induced crosstalk (in dB if attenuation) from either reference voltage VSS or VCC onto an analog differential signal pair SigP/N carried by a pair of victim bondwires at different frequencies of the differential signal for two different bondwire configurations.

FIG. 3 graphically shows how the present invention reduces crosstalk induced by aggressor bondwires onto victim bondwires. In particular, FIG. 3 shows the magnitude of induced crosstalk (in dB of attenuation) from either reference voltage VSS or VCC onto an analog differential signal pair SigP/N carried by a pair of victim bondwires at different frequencies of the differential signal for two different bondwire configurations: (i) a floating configuration in which the shielding bondwires are connected to ground on the package side, but unconnected on the die side and (ii) (i) a shorted configuration in which the shielding bondwires are connected to ground on the package side and shorted together on the die side to form a two-dimensional Faraday cage. As indicated in FIG. 3, shorting the shielding bondwires together reduces crosstalk by as much as 10 dB. FIG. 3 also indicates that the shielding is more effective at lower frequencies, although there are some higher-frequency effects that can come into play with these structures.

Although the present invention has been described in the context of an exemplary situation in which a pair of adjacent victim bondwires are shielded from a first plurality of aggressor bondwires on a first side by a first shielding bondwire and from a second plurality of aggressor bondwires on a second side by a second shielding bondwire, the invention is not limited to that particular situation. In general, the present invention applies to situations having the following characteristics:

There is a set of one or more adjacent victim bondwires;

There are one or more aggressor bondwires located on one side of the victim set and zero, one, or more aggressor bondwires located on the other side of the victim set. In other words, there might be aggressor bondwires located only on one side of the victim set; and There is a first set of one or more shielding bondwires adjacent to the victim set on one side and a second set of one or more shielding bondwires adjacent to the victim set on the other side. In other words, there may be more than one shielding bondwire on one or both sides of the victim set, and the numbers of shielding bondwires can be different.

In a situation in which there are more than one shielding bondwire on one or both sides of the victim set, each shielding bondwire is connected, on the package side of the component, to a reference voltage and, on the die side of the component, to at least one shielding bondwire on the other side of the victim set that is connected to that same reference voltage.

Assume, for example, that there are two shielding bondwires on either side of the victim set. In one possible configuration, all four shielding bondwires are connected, on the package side, to the same reference voltage and, on the die side, to each other. This situation corresponds to a single two-dimensional Faraday cage.

In another possible configuration, the two outer shielding bondwires are connected, on the package side, to a first reference voltage (e.g., ground) and, on the die side, to each other via a first metal connection, while the two inner shielding bondwires are connected, on the package side, to a second, different reference voltage (e.g., supply) and, on the die side, to each other via a second metal connection that is electrically isolated from the first metal connection. This latter configuration corresponds to two nested two-dimensional Faraday cages surrounding the victim set.

Either of these configurations may provide increased crosstalk suppression compared to the single two-dimensional Faraday cage formed from a single shielding bondwire on either side of the victim set.

In a situation in which there are one or more aggressor bondwires located on only one side of a first set of one or more adjacent victim bondwires, the phrase "first and second shielding bondwires between the one or more aggressor bondwires and the first set" as used in the claims should be interpreted as referring to the fact that one of the shielding bondwires is located between the one or more aggressor bondwires and the first set of one or more adjacent victim bondwires, even though the other shielding bondwire is not itself located between the aggressor and victim bondwires.

Furthermore, a packaged electronic component of the present invention may have one or more instances of two-dimensional Faraday cages surrounding different victim sets around the die, where different Faraday cages might or might not be connected to one another on the die side. If two or more Faraday cages are interconnected on the die side, then they are also connected to the same reference voltage on the package side. On the other hand, two or more Faraday cages that are not interconnected on the die side, can be, but do not have to be, connected to different reference voltages on the package side.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A packaged electronic component comprising:
   a die defining a die side of the component;
   a package defining a package side of the component; and
   a plurality of bondwires interconnecting the die and the package, wherein the plurality of bondwires comprises:
      a first set of one or more victim bondwires;
      one or more aggressor bondwires on one or both sides of the first set of one or more victim bondwires; and
      first and second shielding bondwires between the one or more aggressor bondwires and the first set of one or more victim bondwires, wherein the first and second shielding bondwires are electrically connected (i) to a first reference voltage on the package side of the component and (ii) to each other on the die side of the component, and not otherwise electrically connected on the die side.

2. The invention of claim 1, wherein the first reference voltage is ground.

3. The invention of claim 1, wherein the first reference voltage is not ground.

4. The invention of claim 1, wherein the first and second shielding bondwires are electrically connected to each other on the die side of the component by an electrically conductive connection on the die.

5. The invention of claim 1, wherein the plurality of bondwires further comprises:
   a second set of one or more victim bondwires;
   one or more aggressor bondwires on one or both sides of the second set of one or more victim bondwires;
   third and fourth shielding bondwires between the one or more aggressor bondwires and the second set of one or more victim bondwires, wherein the third and fourth shielding bondwires are electrically connected (i) to a second reference voltage on the package side of the component and (ii) to each other on the die side of the component.

6. The invention of claim 5, wherein the first and second shielding bondwires are not electrically connected to the third and fourth shielding bondwires on the die side of the component.

7. The invention of claim 6, wherein the first reference voltage is different from the second reference voltage.

8. The invention of claim 5, wherein the first reference voltage is equal to the second reference voltage.

9. A packaged electronic component comprising:
   a die defining a die side of the component;
   a package defining a package side of the component; and
   a plurality of bondwires interconnecting the die and the package, wherein the plurality of bondwires comprises:
      a first set of one or more victim bondwires;
      one or more aggressor bondwires on one or both sides of the first set of one or more victim bondwires;
      first and second shielding bondwires between the one or more aggressor bondwires and the first set of one or more victim bondwires, wherein the first and second shielding bondwires are electrically connected (i) to a first reference voltage on the package side of the component and (ii) to each other on the die side of the component, and not otherwise electrically connected on the die side; and
      third and fourth shielding bondwires between the one or more aggressor bondwires and the first set of one or more victim bondwires, wherein the third and fourth shielding bondwires are electrically connected (i) to a second reference voltage on the package side of the component and (ii) to each other on the die side of the component,
   wherein the first and second shielding bondwires are not electrically connected to the third and fourth shielding bondwires on the die side of the component.

10. The invention of claim 9, wherein:
    the first and second shielding bondwires are electrically connected to each other on the die side of the component by a first electrically conductive connection on the die; and
    the third and fourth shielding bondwires are electrically connected to each other on the die side of the component by a second electrically conductive connection on the die.

11. The invention of claim 9, wherein the first reference voltage is different from the second reference voltage.

* * * * *